(12) United States Patent
Basco et al.

(10) Patent No.: US 7,851,294 B1
(45) Date of Patent: Dec. 14, 2010

(54) NANOTUBE MEMORY CELL WITH FLOATING GATE BASED ON PASSIVATED NANOPARTICLES AND MANUFACTURING PROCESS THEREOF

(75) Inventors: Andrea Basco, Naples (IT); Maria Viviana Volpe, Pozzuoli (IT); Maria Fortuna Bevilacqua, Gragnano (IT); Valeria Casuscelli, Naples (IT)

(73) Assignee: STMicroelectronics, S.r.l., Agrate Brianza (IT)

(*) Notice: Subject to any disclaimer, the term of this patent is extended or adjusted under 35 U.S.C. 154(b) by 795 days.

(21) Appl. No.: 11/518,385

(22) Filed: Sep. 8, 2006

(30) Foreign Application Priority Data

Sep. 8, 2005   (EP) .................................. 05108235

(51) Int. Cl.
*H01L 21/8238* (2006.01)
(52) U.S. Cl. ................... 438/211; 438/201; 438/257; 438/761; 438/763; 257/202; 257/239; 257/288; 257/315; 257/316; 977/742; 977/841; 977/938
(58) Field of Classification Search ............... 977/742, 977/841, 938; 438/761, 763, FOR. 395, 438/197, 201, 211, 257, 593; 257/E51.04, 257/202, 239, 288, 314, 315, 316, 317, E29.129, 257/E29.3, E21.179
See application file for complete search history.

(56) References Cited

U.S. PATENT DOCUMENTS

| 6,159,620 | A | 12/2000 | Heath et al. | |
|---|---|---|---|---|
| 2002/0098653 | A1* | 7/2002 | Flagan et al. | 438/260 |
| 2003/0034486 | A1* | 2/2003 | Korgel | 257/13 |
| 2005/0175507 | A1* | 8/2005 | Tsukruk | 422/68.1 |
| 2005/0263456 | A1* | 12/2005 | Cooper et al. | 210/660 |
| 2006/0118853 | A1* | 6/2006 | Takata et al. | 257/314 |
| 2006/0222592 | A1* | 10/2006 | Burda | 424/9.6 |
| 2006/0246438 | A1* | 11/2006 | McCall et al. | 435/6 |
| 2007/0018342 | A1* | 1/2007 | Sandhu et al. | 257/E29.071 |

FOREIGN PATENT DOCUMENTS

EP    1 341 184 A1    9/2003

(Continued)

OTHER PUBLICATIONS

S. J. Wind, et al., "Transistor structures for the study of scaling in carbon nanotubes", J. Vac. Sci, Technol. b 21(6), Nov./Dec. 2003, American Vacuum Society, 2003, pp. 2856-2859.

(Continued)

*Primary Examiner*—N Drew Richards
*Assistant Examiner*—Joannie A Garcia
(74) *Attorney, Agent, or Firm*—Lisa K. Jorgenson; Kevin D. Jablonski; Graybeal Jackson LLP (57) ABSTRACT

A method for manufacturing a nanotube non-volatile memory cell is proposed. The method includes the steps of: forming a source electrode and a drain electrode, forming a nanotube implementing a conduction channel between the source electrode and the drain electrode, forming an insulated floating gate for storing electric charges by passivating conductive nanoparticles with passivation molecules and arranging a disposition of passivated conductive nanoparticles on the nanotube, the conductive nanoparticles being adapted to store the electric charges and being insulated by the passivation molecules from the nanotube, and forming a control gate coupled with the channel.

37 Claims, 3 Drawing Sheets

FOREIGN PATENT DOCUMENTS

EP    1 420 414 A1    5/2004

OTHER PUBLICATIONS

B C Satishkumar, et al., "The decoration of carbon nanotubes by metal nanoparticles", Rapid Communication, 1996 IPO Publishing Ltd., pp. 3173-3176.

K Tsukagoshi, et al., "Multiple-layer conduction and scattering property in multi-walled carbon nanotubes", New Journal of Physics 6 (2004).

Giles P. Siddons, et al., "Highly Efficient Gating and Doping of Carbon Nanotubes with Polymer Electrolytes", Nano Letters 2004 vol. 4, No. 5, pp. 927-931.

Young-Seok Shon, et al., "Fullerene-linked gold nanoparticles: synthesis and layer-by-layer growth on a solid surface", Chem. Commun., 2002, pp. 2560-2561.

Young-Seok Shon, et al., "Fullerene-Terminated Alkanethiolate SAMs on Gold Generated from Unsymmetrical Disulfides", Langmuir, vol. 15, No. 16, 1999, pp. 5329-5332.

Tongxin Wang, et al., "Preparation, Characterization, and Photophysical Properties of Alkanethiols with Pyrene Units—Capped Gold Nanoparticles: Unusual Fluorescence Enhancement for the Aged Solutions of These Gold Nanoparticles", Langmuir, vol. 18, No. 5, 2002, pp. 1840-1848.

Hisashi Fujihara, et al., "Fullerenethiolate-Functionalized Gold Nanoparticles: A New Class of Surface-Confined Metal—C60 Nanocomposites", Langmuir, vol. 17, No. 21, 2001, pp. 6393-6395.

P. K. Sudeep, et al., "Fullerene-Functionalized Gold Nanoparticles. A Self-Assembled Photoactive Antenna-Metal Nanocore Assembly", Nano Letters, 2002, vol. 2, No. 1, pp. 29-35.

K. George Thomas, et al., "Photochemistry of chromophore-functionalized gold nanoparticles", Pure Appl. Chem., vol. 74, No. 9, pp. 1731-1738, 2002.

Hongjuan Fang, et al., "Self-assembly of the fullerene-substituted oligopyridines on Au nanoparticles and the optical nonlinearities of the nanoparticles", Chemical Physics Letters 364 (2002) pp. 290-296.

Chenguang Lu, et al., "Polymer Electrolyte-Gated Carbon Nanotube Field-Effect Transistor", Nano Letters, 2004, vol. 4, No. 4, pp. 623-627.

European Search Report for EP 05 10 8235, Mar. 22, 2006.

\* cited by examiner

NANOTUBE MEMORY CELL WITH FLOATING GATE BASED ON PASSIVATED NANOPARTICLES AND MANUFACTURING PROCESS THEREOF

This application claims priority from European patent application No. EP05108235.2, filed Sep. 8, 2005, which is incorporated herein by reference.

TECHNICAL FIELD

An embodiment of the present invention relates to the nanotechnology field. More specifically, the invention relates to nanotube non-volatile memory cells.

BACKGROUND

Devices based on non-volatile memory cells are commonly used in several applications when the data stored therein needs to be preserved even when a power supply is off.

A largely employed solution for implementing those memory cells is based on floating-gate MOSFETs, which are typically integrated in a silicon substrate for obtaining an EPROM or an EEPROM (such as a flash memory). Typically, a floating-gate MOSFET has two gates stacked over a channel region between a source region and a drain region. The gate (referred to as floating gate) interposed between the channel region and the other gate is electrically insulated from the channel region and the other gate (for example, the floating gate is surrounded with silicon dioxide). The other gate (referred to as control gate) is electrically connected as in a common MOSFET.

Nowadays, the floating-gate MOSFETs for memory devices typically have to satisfy the existing demand for more and more compact circuits, that continually steers the microelectronics industry into submicron regions.

In particular, for allowing a more aggressive scaling of the floating gate oxide, recently some innovations for memory devices have been proposed in which gold nanoparticles are exploited as storage elements in traditional silicon devices. In detail, the floating gate is made by a layer of gold nanoparticles passivated with organic molecules over a first layer of insulating material (such as silicon dioxide) of only few nanometers. In this way, considering the length of the passivation molecules, a distance between a silicon surface and the gold nanoparticles is of only tens of nanometers. A second layer of insulating material (such as an organic insulator) overlaps the passivated nanoparticles.

In order to manufacture high-density memory devices, the control-gate, source, and drain sizes should also be reduced. However, this may impair the electric characteristics of the floating-gate MOSFET. For example, a large electric resistance can be induced or a punch-through phenomenon (in which a depletion zone of the source region contacts a depletion zone of the drain region) can occur.

Recently, memory cells implemented by exploiting carbon nanotubes have been studied. Carbon nanotubes are carbon allotropes having a structure that can be described as a sheet of graphite, rolled so as to form a cylinder and ended by two hemispheres. The carbon atoms in the nanotube are bound together so as to form hexagons. The nanotube has a nano-sized diameter and a length of the order of hundreds of nanometers; the nanotube, depending on a twist along its axis, can also feature a semiconducting electric behavior (i.e., a non-ohmic behavior affected by a control voltage).

An example of carbon nanotube memory cell is disclosed in EP1341184, which is incorporated by reference. In this case, a source electrode and a drain electrode are formed on a substrate, and a carbon nanotube is interposed between the source electrode and the drain electrode to implement a channel. A memory element is located over the carbon nanotube, and a gate electrode is formed in contact with the memory element. The memory element includes a first insulating film in contact with the carbon nanotube, a charge storage film deposited on the first insulating film, and a second insulating film formed on the charge storage film (contacting the gate electrode). Particularly, the first and the second insulating films are formed of silicon oxide, and the charge storage film is formed of silicon or silicon nitride. Alternatively, the charge storage film includes a porous film (for example, of aluminum oxide) having a plurality of nanodots filled with a charge storage material (such as silicon or silicon nitride).

A memory cell based on a vertical nanotube is instead disclosed in EP1420414, which is incorporated by reference. In detail, the memory cell includes a source region formed into a substrate; a nanotube array is composed of a plurality of nanotube columns vertically grown on the substrate (so that an end of the nanotube array is in contact with the source region). A memory element is formed around the nanotube array, and a control gate is formed around the memory element. A drain region is in contact with the other end of the nanotube array. In this solution, the memory element includes a first insulation layer formed around the nanotube array, an electron-storing layer formed around the first insulation layer, and a second insulation layer formed around the electron-storing layer (contacting the gate electrode). Particularly, the first and the second insulation layers are silicon oxide layers, and the electron-storing layer is a silicon layer, a silicon nitride layer, or a porous layer (filled with silicon or silicon nitride).

However, in the solutions known in the art, the memory element has a conventional three-layers structure. This structure may suffer from an inherent limit in its minimum thickness (for example, of the order of tens of nanometers).

In addition, the corresponding manufacturing process of the memory cells based on the nanotubes may be relatively complex and expensive. This may hinder the widespread diffusion of such a technology.

SUMMARY

According to an embodiment of the present invention, the idea of exploiting passivated conductive nanoparticles for forming the floating gate is suggested.

Particularly, an embodiment of the invention proposes a method for manufacturing a nanotube non-volatile memory cell. The method starts with the step of forming a source electrode and a drain electrode. The method continues by forming a nanotube, which implements a conduction channel between the source electrode and the drain electrode. An insulated floating gate (for storing electric charges) is then formed. This result is achieved by passivating conductive nanoparticles with passivation molecules, and then arranging a disposition of passivated conductive nanoparticles on the nanotube. The conductive nanoparticles are adapted to store the electric charges, and are insulated by the passivation molecules from the nanotube. The method ends with the step of forming a control gate coupled with the channel.

In an embodiment of the invention, a carbon nanotube is used.

The conductive nanoparticles may be made of gold.

In an embodiment of the invention, the passivated nanoparticles are adsorpted on the nanotube.

As a further enhancement, the passivated nanoparticles, the nanotube or both of them may be functionalized for facilitating the adsorption.

Suggested examples of passivation molecules are also proposed (such as hydrocarburic or aromatic thiols).

In an embodiment, the adsorption is achieved by dipping the nanotube into a solution with the passivated nanoparticles.

A way to further improve the solution is by forming the control gate with a layer of polymer electrolyte.

Examples of the polymer electrolyte are also proposed.

A further embodiment of the present invention provides a corresponding nanotube non-volatile memory cell.

A still further embodiment of the present invention provides a non-volatile memory device including those memory cells.

Features and advantages of at least one embodiment of the invention will be best understood by reference to the following detailed description, given purely by way of a non-restrictive indication, to be read in conjunction with the accompanying drawings.

DETAILED DESCRIPTION

Figure 1:
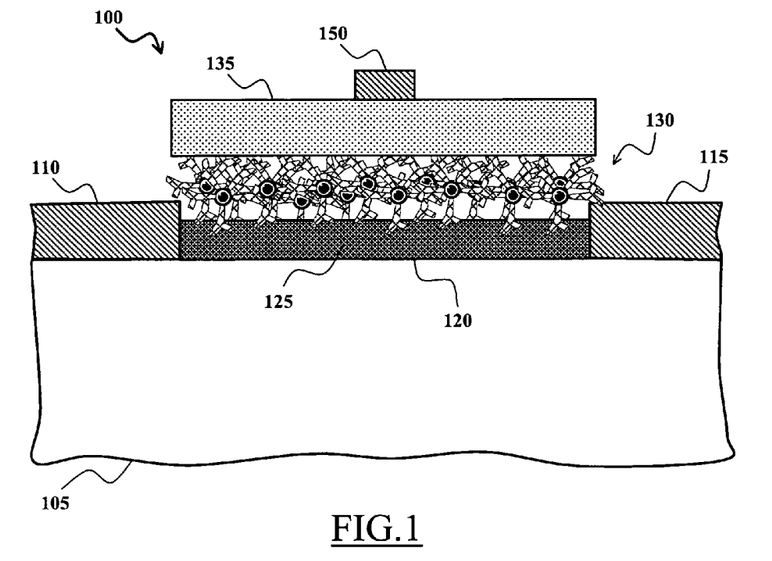
FIG. 1 shows a cross-sectional view of a non-volatile nanotube memory cell according to a first embodiment of the present invention.

With reference to the drawings, and in particular to FIG. 1, a non-volatile nanotube memory cell 100 is shown according to an embodiment of the invention. The memory cell 100 is formed on a substrate 105. The substrate 105 may be of a material resistant to relatively high temperatures and inert with respect to chemical elements or compounds exploited during a manufacturing process of the memory cell 100. For example, the substrate 105 is a silicon substrate, but also other materials such as alumina, zirconia, silica, titania, aluminum nitride, silicon nitride, boron nitride, metallic silicates, titanates, niobates, glass ceramics and quartz are suitable.

The memory cell 100 further includes a source electrode 110 and a drain electrode 115 formed over an upper surface 120 of the substrate 105. The source and drain electrodes 110 and 115 are separated from each other and made, for example, of gold; the source and drain electrodes 110 and 115 have, for example, a height ranging between 30 nm and 60 nm (for example 30 nm).

The source and drain electrodes 110 and 115 are connected by a semiconductive carbon nanotube 125 formed over the surface 120 of the substrate 105 (with the nanotube 125 having a longitudinal axis parallel to the surface 120). The nanotube 125 implements a channel, which permits electric charges (or carriers) to move between the source electrode 110 and the drain electrode 115. The nanotube 125 has a diameter ranging between 0.8 nm and 3 nm (for example 2-3 nm), and a length ranging between 100 nm and 20 µm (for example 1 µm).

An upper surface of the nanotube 125, opposite to a surface thereof in contact with the substrate 105, is covered with passivated conductive nanoparticles (i.e., nanoparticles coated so as to reduce their reactivity). The passivated nanoparticles are arranged over the nanotube 125 in such a way to form a disposition 130 (like a layer); the layer 130 of passivated nanoparticles implements a floating gate (for trapping the electric charges from the nanotube 125), which defines the memory element of the cell 100. The molecules exploited for passivating the nanoparticles act as an insulating shield around them (of a thickness, for example, of about 2-3 nm), in such a way as to insulate the nanoparticles electrically from the nanotube 125. The layer 130 of passivated nanoparticles has a very small size, with a thickness ranging between 2 nm and 7 nm (for example 5 nm).

For example, the nanoparticles 130 are made of a transition metal, such as gold, and functionalized with long chain hydrocarburic or aromatic thiols, in such a way to facilitate their anchoring to the upper surface of the nanotube 125. For this purpose, the hydrocarburic or aromatic thiols (exploited for the passivation) are ended, for example, with pending aryl, pyrenyl, antracenyl, fenantrenyl, or fullerenic groups (see, for example, "Chemical Physics Letters 364 (2002) 290-296", "Pure Appl. Chem., Vol. 74, No. 9, pp. 1731-1738, 2002", Nano Letters 2002 Vol. 2, No. 1 29-35", "Langmuir 2001, 17, 6393-6395", "Langmuir 2002, 18, 1840-1848", "Langmuir 1999, 15, 5329-5332", and "Chem. Commun. 2002, 2560-2561", all of which are incorporated by reference). These groups are able to interact with the upper surface of the nanotube 125 by Van der Waals forces, n-stackings and the like, so as to permit a physical adsorption into the upper surface of the nanotube 125 without altering its semiconductive properties (i.e., due to the adhesion of an extremely thin layer of passivated nanoparticles 130).

In an embodiment, a control gate 135 is formed over the layer 130 of passivated nanoparticles. The control gate 135 is an electrochemical gate with an aqueous electrolyte solution exploited as dielectrics (see, for example, "Nano Letters 2004 Vol. 4, No. 5 927-931" or "Nano Letters 2004 Vol. 4, No. 4 623-627", all of which are incorporated by reference). Particularly, a polymer electrolyte is used as gate medium in which an aqueous solution, such as $LiClO_4, 3H_2O$, is dissolved. For example, the polymer electrolyte is poly(ethylene oxide) (PEO, average weight $M_n$ 550 or 1000), poly(ethylenimine) (PEI, average weight $M_n$ 800), or poly(acrylic acid) (PAA, average weight $M_n$ 1240). Weight ratios of polymer to $LiClO_4$ solution, for example, are 2.3:1, 2.5:1 and 1.6:1 for PEO, PEI and PAA, respectively. The control gate 135 has a height ranging between 30 nm and 60 nm (for example 30 nm). A gate electrode 150 is formed over the control gate 135 (for example, by means of a silver wire).

The main steps of an exemplary process for the manufacturing of the above-described memory cell are explained hereinbelow with reference to FIGS. 2A-2D according to an embodiment of the invention.

Figure 2A:
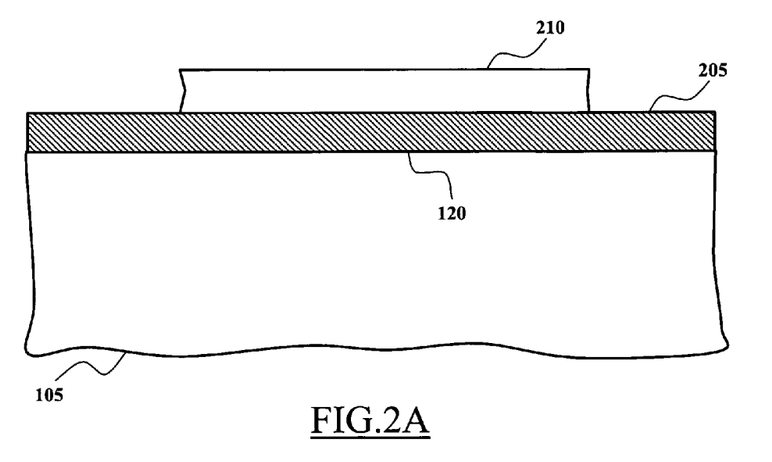
FIGS. 2A-2D are cross-sectional views of the memory cell of FIG. 1 at various stages of a manufacturing process according to an embodiment of the present invention.

Considering FIG. 2A, at a first step the upper surface 120 of the silicon substrate 105 is covered by a thin film 205 (e.g., less than 2 nm, for example 1 nm) of a catalyst used for the formation of the nanotube. The catalyst is a metal, such as cobalt, nickel or iron. The catalyst film 205 is grown, for example, by physical procedures, such as evaporation, sputtering and laser ablation. Also chemical procedures can be exploited in which the substrate 105 is coated with, for example, a solution containing a metal catalyst.

Successively, the catalyst film 205 is processed by exploiting a conventional mask 210 for a lithographic etching. Particularly, the catalyst film 205 is patterned for obtaining catalyst clusters regularly arranged over the upper surface 120 of the silicon substrate 105. The etching may be a wet etching or a dry etching (e.g., RIE). Other lithographic procedures can be exploited, such as electron-beam lithography and Focused Ion Beam lithography. Furthermore, a lift-off technique can be applied in which a resist is deposited and patterned over the upper surface 120 of the silicon substrate 105, the metal catalyst is deposited, and then the patterned resist with the overlying metal catalyst is removed.

Figure 2B:
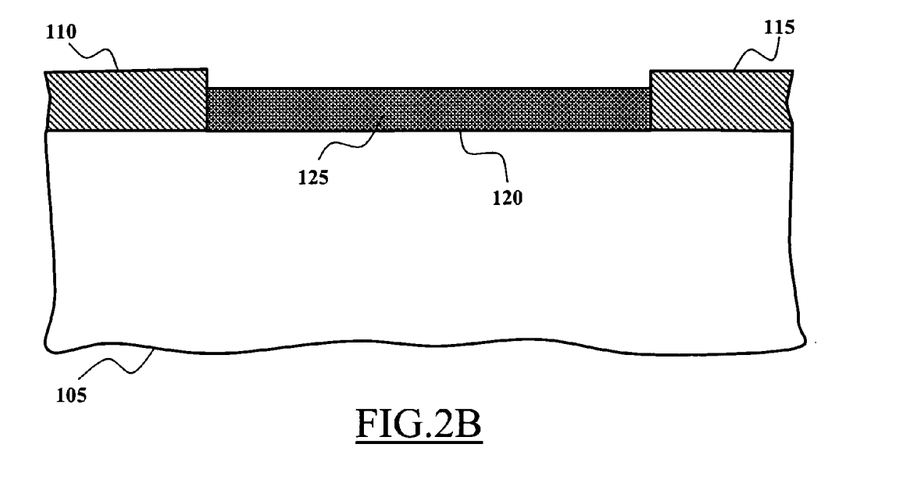

As depicted in FIG. 2B, the nanotube 125 is grown, for example, by means of a Chemical Vapor Deposition (shortly, CVD) process. During the CVD process different hydrocarbons such as benzene, pentane, acetylene, methane and also carbon monoxide are decomposed over the catalyst clusters at temperatures between 500° C. and 1200° C., in presence of a carrier gas, such as $H_2$, Ar, and $NH_3$. The chamber used for this procedure is a UHV (Ultra High Vacuum) reactor where it is possible to control different parameters (such as gas flow, pressure, temperature) and then the nanotube growth. Alternatively, the nanotube 125 is synthesized by means of a laser ablation of a graphite target or by means of an arc-discharge technique in which two carbon electrodes are exploited.

Still referring to FIG. 2B, the (metal) source and drain electrodes 110 and 115 are realized by a process similar to that described above for obtaining the catalyst clusters. Particularly, evaporation, sputtering or chemical deposition techniques can be exploited for the deposition of a metal layer, followed by patterning procedures.

Figure 2C:
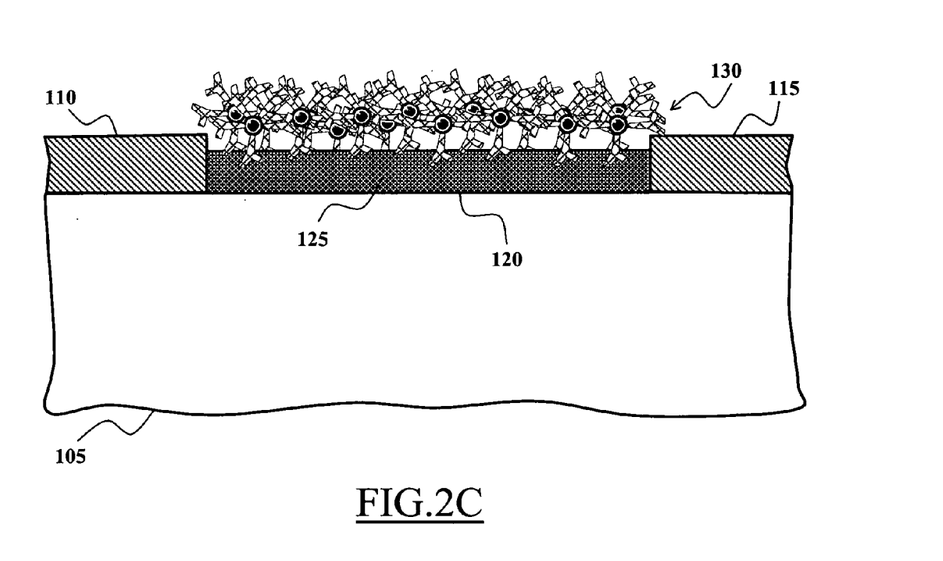

Considering now FIG. 2C, the nanotube 125 is decorated with passivated nanoparticles. For this purpose, the nanoparticles, functionalized by long chain hydrocarburic or aromatic thiols with suitable pending groups, are synthesized, for example, by the well-known Brust's procedure or a slightly modified version thereof. Generally, this procedure is based on gold reduction reaction occurring in a biphasic medium by employing $NaBH_4$, as reducing agent, in presence of tetraoctylammonium bromide, as phase transfer agent, and dodecanthiol, as capping molecules. The dodecanthiol molecules are chemisorbed over the gold nanoparticle surface. The dodecanthiol molecules can be replaced, for example, with pyrenethiol molecules by a place-exchange reaction. Alternatively, it is possible to obtain stabilized gold nanoparticles with tetraoctylammonium bromide and then to replace the physically adsorbed surfactant molecules with pyrenethiol molecules. In order to obtain the layer 130 of nanoparticles over the nanotube 125, the substrate 105 supporting the nanotube 125 is dipped into a functionalized gold nanoparticle solution so as to allow the gold nanoparticles to anchor to the nanotube 125.

Figure 2D:
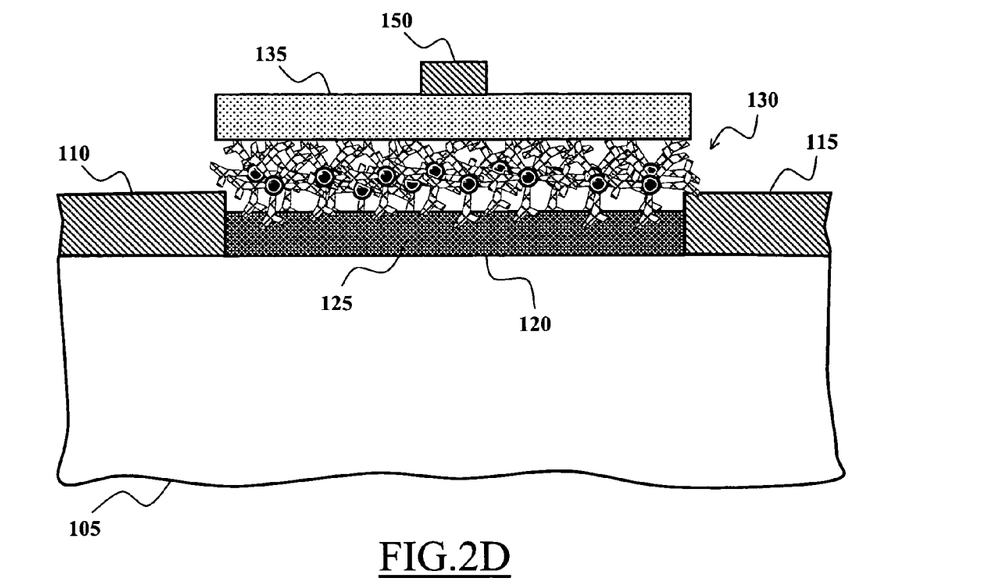

Referring to FIG. 2D, the control gate 135 is then obtained by using polymer electrolytes as gate medium. The polymer electrolytes are prepared, for example, by directly dissolving $LiClO_4,3H_2O$ in the desired polymer. Particularly, a rigorous drying of PEO electrolytes and $LiClO_4$ is performed. PEI electrolytes are injected into a poly-(dimethylsiloxane) fluidic channel placed over the layer 130 of nanoparticles. Alternatively, PAA and $LiClO_4$ are dissolved in acetone and the memory cell 100 is spin coated; then, PAA and $LiClO_4$ are dried under vacuum for several hours. However, a combination of additives and different host polymer materials can be exploited; moreover, microfabrication techniques and other methods (such as a layer-by-layer deposition of polymers) are tenable.

Finally, the gate electrode 150 is obtained in a similar way to that exploited for obtaining the source and drain electrodes 110 and 115.

It should be appreciated that the above-described process may be used for manufacturing a plurality of nanotube memory cells at the same time. Moreover, the process steps described above may be incorporated in a process for fabricating further different transistors, and especially for fabricating complex electronic circuits (such as memory devices).

The electrochemical control gate 135 may limit a leakage current therethrough (e.g., below 500 pA) when relatively high voltages are applied.

Alternatively, the control gate 135 includes a first thin layer (e.g., 15 nm) of a dielectric, such as silicon dioxide, and an overlapping second layer made of a conductive material, such as aluminum. The gate electrode 150 is formed over the control gate 135 and it is made, for example, of titanium carbide. However, this solution may have the drawback that the oxide growth or deposition often needs to be performed at high temperatures, which might be dangerous for the organic molecules coupling the gold nanoparticles with the nanotube 125.

Figure 3:
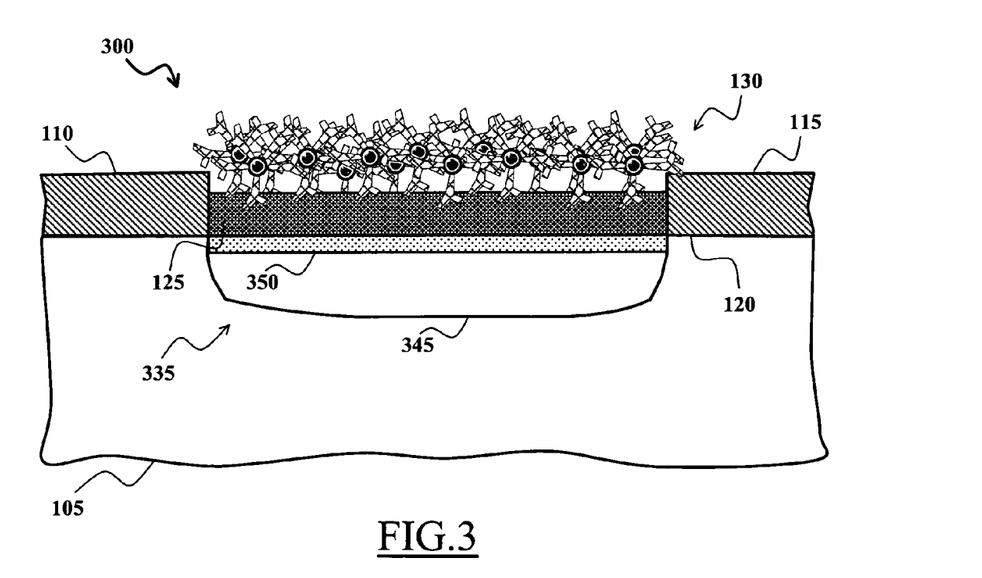
FIG. 3 shows a cross-sectional view of a non-volatile nanotube memory cell according to a second embodiment of the present invention.

FIG. 3 shows a memory cell 300 according to another embodiment of the present invention (the elements corresponding to those depicted in FIG. 1 are denoted with the same reference numerals and their description is omitted for the sake of simplicity).

In this case, a back control gate 335 is formed into the substrate 105 (particularly, below the nanotube 125), instead of being formed on the top of the memory cell 300.

The back control gate 335 is formed, for example, by a first layer of P-doped silicon 345 (the letter P indicates that the doping ions are acceptor) coated, for example, with thermal silicon dioxide 350. In detail, before forming the catalyst clusters, a selective implant of P type dopants is performed in the substrate 105 and, successively, a layer of silicon dioxide is selectively obtained at the surface 120 of the substrate 105, for example, by oxidation at high temperature. Alternatively, the back control gate 335 is made of a metal layer, such as of aluminum coated with subnanometer-thick native $Al_2O_3$ or tungsten coated with silicon dioxide.

In the manufacturing process of this embodiment of the memory cell 300, the step of forming the back control gate 335 is performed before the nanotube growth and the passivated nanoparticles decoration thereof. Accordingly, the control gate formation does not interact or damage the passivating molecules exploited for the floating gate.

Nevertheless, it should be noted that the memory cells with top control gates such as shown in FIGS. 1 and 2D often show better performance than the memory cells with bottom control gates such as shown in FIG. 3.

In both cases, the exploitation of the nanotube decorated with passivated nanoparticles allows shrinking the memory cell sizes (with respect to nanotube memory cells exploiting the conventional three-layers floating gate structure). The memory element including the passivated nanoparticles anchored to the nanotube has a very small thickness of only few nanometers (instead of the typical thickness of tens of nanometers of the three-layers floating gate structures).

In addition, the proposed manufacturing process is of simple application; the same manufacturing process is also cost and time effective (with respect to the process in which a layer-by-layer technique is applied).

All of the above may foster the widespread use of the nanotube technology.

Naturally, in order to satisfy local and specific requirements, a person skilled in the art may apply to the solution described above many modifications and alterations. Particularly, although the present invention has been described with a certain degree of particularity with reference to embodiments thereof, it should be understood that various omissions, substitutions and changes in the form and details as well as other embodiments are possible; moreover, it is expressly intended that specific elements and/or method steps described in connection with any disclosed embodiment of the invention may be incorporated in any other embodiment as a general matter of design choice.

For example, similar considerations apply if the memory cell has a different structure or includes equivalent components (such as it is based on a vertical geometry with respect to the substrate); in any case, it should be appreciated that the numerical examples described above (such as relating to the size of the elements of the memory cell) are merely illustrative and must not be interpreted in a limitative manner. Likewise, the manufacturing process of the memory cell may comprise equivalent steps (exploiting alternative techniques and/or materials); moreover, it is possible to have additional steps, or the steps may be executed in a different order. Alternatively, any other type of nanotube may be used, either of the single-walled (SWNT) or multi-walled (MWNT) type.

Even though the above-described embodiments have been specifically designed for carbon nanotubes, this not to be interpreted in a limitative manner (with the same technique that may also be applied to nanotubes made of another material, such as inorganic nanotubes).

Likewise, the use of different conductive nanoparticles is not excluded (for example, made of aluminum or magnesium).

It should also be appreciated that alternative techniques for forming the layer of passivated nanoparticles are within the scope of the invention.

In addition, the use of different passivation molecules is contemplated.

Similar considerations apply if the passivated nanoparticles are adsorbed on the nanotube with a different procedure (for example, by functionalizing the nanotube in alternative or in addition to the passivated nanoparticles).

Likewise, any other polymer electrolyte may be used for forming the control gate.

At the end, the proposed memory cell leads itself to be used in any non-volatile memory device, such as a flash of EEPROM, and a system such as a computer system, may incorporate such a non-volatile memory device.

What is claimed is:

1. A method for manufacturing a nanotube non-volatile memory cell including the steps of:
   forming a source electrode and a drain electrode,
   forming a nanotube implementing a conduction channel between the source electrode and the drain electrode,
   forming an insulated floating gate for storing electric charges by passivating conductive nanoparticles with passivation molecules and arranging a disposition of adsorpted passivated conductive nanoparticles on the nanotube, the conductive nanoparticles being adapted to store the electric charges and being insulated by the passivation molecules from the nanotube, and forming a control gate coupled with the channel and disposed over the nanotube but not disposed adjacent to the source electrode or adjacent to the drain electrode.

2. The method according to claim 1, wherein the nanotube is a carbon nanotube.

3. The method according to claim 1, wherein the conductive nanoparticles are gold nanoparticles.

4. The method according to claim 1, wherein the step of forming the disposition of passivated conductive nanoparticles includes:
   adsorping the passivated conductive nanoparticles on the nanotube.

5. The method according to claim 4, wherein the step of forming the disposition of passivated conductive nanoparticles further includes:
   functionalizing the passivated conductive nanoparticles and/or the nanotube for facilitating the adsorption.

6. The method according to claim 1, wherein the step of adsorping includes:
   providing a solution with the passivated conductive nanoparticles; and
   dipping the nanotube into the solution.

7. A method for manufacturing a nanotube non-volatile memory cell including the steps of:
   forming a source electrode and a drain electrode,
   forming a nanotube implementing a conduction channel between the source electrode and the drain electrode,
   forming an insulated floating gate for storing electric charges by passivating conductive nanoparticles with passivation molecules and arranging a disposition of passivated conductive nanoparticles on the nanotube, the conductive nanoparticles being adapted to store the electric charges and being insulated by the passivation molecules from the nanotube, and
   forming a control gate coupled with the channel, the control gate disposed under the nanotube;
   wherein the step of forming the disposition of passivated conductive nanoparticles includes:
      adsorbing the passivated conductive nanoparticles on the nanotube and functionalizing the passivated conductive nanoparticles and/or the nanotube for facilitating the adsorption; and
   wherein the passivation molecules include hydrocarburic or aromatic thiols with pending aryl, pyrenyl, antracenyl, fenantrenyl or fullerenic groups.

8. A method for manufacturing a nanotube non-volatile memory cell including the steps of:
   forming a source electrode and a drain electrode,
   forming a nanotube implementing a conduction channel between the source electrode and the drain electrode,
   forming an insulated floating gate for storing electric charges by passivating conductive nanoparticles with passivation molecules and arranging a disposition of passivated conductive nanoparticles on the nanotube, the conductive nanoparticles being adapted to store the electric charges and being insulated by the passivation molecules from the nanotube, and
   forming a control gate coupled with the channel;
   wherein the step of forming the control gate includes:
      forming a layer of polymer electrolyte on the disposition of passivated conductive nanoparticles, the conductive nanoparticles being insulated by the passivation molecules from the layer of polymer electrolyte.

9. The method according to claim 8, wherein the polymer electrolyte is selected in the group including poly(ethylene oxide), poly(ethylenimine), and poly(acrylic acid).

10. A nanotube non-volatile memory cell including:
   a source electrode and a drain electrode;
   a nanotube implementing a conduction channel between the source electrode and the drain electrode;
   an insulated floating gate for storing electric charges formed by a disposition of conductive nanoparticles passivated with passivation molecules being arranged in an adsorpted manner on the nanotube, the conductive nanoparticles being adapted to store the electric charges and being insulated by the passivation molecules from the nanotube; and
   a control gate coupled with the channel, the control gate having no portion disposed adjacent to the source electrode or the drain electrode.

11. The nanotube non-volatile memory cell according to claim 10, wherein the nanotube is a carbon nanotube.

12. The nanotube non-volatile memory cell according to claim 10, wherein the conductive nanoparticles are gold nanoparticles.

13. The nanotube non-volatile memory cell according to claim 10, wherein the passivated conductive nanoparticles and/or the nanotube are functionalized for facilitating the adsorption.

14. A non-volatile memory device including a plurality of memory cells according to claim 10.

15. A nanotube non-volatile memory cell including:
a source electrode and a drain electrode;
a nanotube implementing a conduction channel between the source electrode and the drain electrode;
an insulated floating gate for storing electric charges formed by a disposition of adsorbed conductive nanoparticles passivated with passivation molecules being arranged on the nanotube, the conductive nanoparticles being adapted to store the electric charges and being insulated by the passivation molecules from the nanotube; and
a control gate coupled with the channel and disposed under the nanotube;
wherein the passivated conductive nanoparticles are adsorbed on the nanotube such that the passivated conductive nanoparticles and/or the nanotube are functionalized for facilitating the adsorption; and
wherein the passivation molecules include hydrocarburic or aromatic thiols with pending aryl, pyrenyl, antracenyl, fenantrenyl or fullerenic groups.

16. A nanotube non-volatile memory cell including:
a source electrode and a drain electrode;
a nanotube implementing a conduction channel between the source electrode and the drain electrode;
an insulated floating gate for storing electric charges formed by a disposition of conductive nanoparticles passivated with passivation molecules being arranged on the nanotube, the conductive nanoparticles being adapted to store the electric charges and being insulated by the passivation molecules from the nanotube; and
a control gate coupled with the channel;
wherein the control gate includes:
a layer of polymer electrolyte formed on the disposition of passivated conductive nanoparticles, the conductive nanoparticles being insulated by the passivation molecules from the layer of polymer electrolyte.

17. The nanotube non-volatile memory cell according to claim 16, wherein the polymer electrolyte is selected in the group including poly(ethylene oxide), poly(ethylenimine), and poly(acrylic acid).

18. A non-volatile memory, comprising:
first and second source/drain regions comprising metal;
a nanotube disposed between the first and second source/drain regions;
a floating gate disposed adjacent to the nanotube, the floating gate including,
adsorbed conductive nanoparticles, and
electrically insulating molecules disposed between the nanotube and the nanoparticles; and
a control gate disposed adjacent to the nanotube and not adjacent to the first and second source/drain regions.

19. The non volatile memory of claim 18 wherein the first and second source/drain regions each comprise a metal.

20. The non volatile memory of claim 18 wherein the molecules surround the nanoparticles.

21. The non volatile memory of claim 18 wherein the molecules comprise passivating molecules.

22. The non volatile memory of claim 18 wherein the molecules are disposed between the nanoparticles and the control gate.

23. The non volatile memory of claim 18 wherein:
the nanotube has a first side and a second side;
the floating gate is disposed adjacent to the first side of the nanotube; and
the control gate is disposed adjacent to the second side of the nanotube.

24. The non volatile memory of claim 18 wherein:
the nanotube has a first side and a second side opposite the first side;
the floating gate is disposed adjacent to the first side of the nanotube; and
the control gate is disposed adjacent to the second side of the nanotube.

25. The non volatile memory of claim 18, further comprising:
a semiconductor substrate; and
wherein the first and second drain/source regions, the nanotube, the floating gate, and the control gate are disposed adjacent to the substrate.

26. A non-volatile memory, comprising:
first and second source/drain regions;
a nanotube disposed between the first and second source/drain regions;
a floating gate disposed adjacent to the nanotube, the floating gate including,
conductive nanoparticles,
electrically insulating molecules disposed between the nanotube and the nanoparticles;
a control gate disposed adjacent to the nanotube; and
a semiconductor substrate;
wherein the first and second drain/source regions and the nanotube are disposed over the substrate;
wherein the floating gate is disposed over the nanotube; and
wherein the control gate is disposed in the substrate beneath the nanotube.

27. A non-volatile memory, comprising:
first and second source/drain regions;
a nanotube disposed between the first and second source/drain regions;
a floating gate disposed adjacent to the nanotube, the floating gate including,
conductive nanoparticles,
electrically insulating molecules disposed between the nanotube and the nanoparticles;
a control gate disposed adjacent to the nanotube;
a semiconductor substrate;
an electrically insulating layer disposed on the substrate;
wherein the nanotube is disposed over the insulator layer;
wherein the first and second drain/source regions are disposed over the substrate;
wherein the floating gate is disposed over the nanotube; and
wherein the control gate is disposed in the substrate beneath the insulating layer.

28. An electronic system, comprising:
a non-volatile memory, comprising,
first and second source/drain regions comprising metal,
a nanotube disposed between the first and second source/drain regions,
a floating gate disposed adjacent to the nanotube, the floating gate including,
adsorbed conductive nanoparticles, and electrically insulating molecules disposed between the nanotube and the nanoparticles; and a control gate disposed adjacent to the nanotube in the substrate.

29. A method, comprising:

forming a nanotube between first and second source/drain regions;

forming adjacent to the nanotube a floating gate having adsorbed conductive nanoparticles and electrically insulating molecules between the nanotube and the nanoparticles; and forming a control gate adjacent to the nanotube such that the control gate includes no portion adjacent to the first and second source/drain regions.

30. The method of claim 29 wherein forming the floating gate comprises causing the molecules to adsorpt to the nanotube.

31. The method of claim 29 wherein:

forming the floating gate comprises forming the floating gate having a first side adjacent to the nanotube; and forming the control gate comprises forming the control gate adjacent to a second side of the floating gate, the second side being opposite to the first side.

32. The method of claim 29 wherein:

forming the floating gate comprises forming the floating gate adjacent to a first side of the nanotube; and forming the control gate comprises forming the control gate adjacent to a second side of the nanotube.

33. The method of claim 29 wherein:

forming the floating gate comprises forming the floating gate adjacent to a first side of the nanotube; and forming the control gate comprises forming the control gate adjacent to a second side of the nanotube, the second side being opposite to the first side.

34. The method of claim 29, further comprising:

forming the first and second source/drain regions on a substrate; and wherein forming the nanotube comprises forming the nanotube on the substrate.

35. A method, comprising:

forming a nanotube between first and second source/drain regions;

forming adjacent to the nanotube a floating gate having conductive nanoparticles and electrically insulating molecules between the nanotube and the nanoparticles; and forming a control gate adjacent to the nanotube; wherein:

forming the nanotube comprises forming the nanotube over a substrate;

forming the floating gate comprises forming the floating gate over the nanotube; and forming the control gate comprises forming the control gate in the substrate beneath the nanotube.

36. A method, comprising:

forming a nanotube between first and second source/drain regions;

forming adjacent to the nanotube a floating gate having conductive nanoparticles and electrically insulating molecules between the nanotube and the nanoparticles;

forming a control gate adjacent to the nanotube; and forming a insulating layer in a substrate;

wherein forming the nanotube comprises forming the nanotube over the insulating layer;

wherein forming the floating gate comprises forming the floating gate over the nanotube; and wherein forming the control gate comprises forming the control gate in the substrate beneath the insulating layer.

37. A method, comprising:

storing a charge in adsorpted conductive nanoparticles of a floating gate; and generating a read current through a nanotube insulated from the floating gate by electrically insulating molecules, the read current generated in response to a signal received at a control gate disposed below the nanotube.

* * * * *

UNITED STATES PATENT AND TRADEMARK OFFICE
CERTIFICATE OF CORRECTION

| | | |
|---|---|---|
| PATENT NO. | : 7,851,294 B1 | Page 1 of 1 |
| APPLICATION NO. | : 11/518385 | |
| DATED | : December 14, 2010 | |
| INVENTOR(S) | : Andrea Basco et al. | |

It is certified that error appears in the above-identified patent and that said Letters Patent is hereby corrected as shown below:

- In Claim 1, Column 7, Line 52 of the patent, "passivation molecules from the nanotube, and forming a--" should read --passivation molecules from the nanotube, and forming a--

- In Claim 19, Column 9, Line 62 of the patent, "The non volatile memory of claim 18 wherein the first" should read --The non-volatile memory of claim 18 wherein the first--

- In Claim 20, Column 9, Line 64 of the patent, "The non volatile memory of claim 18 wherein the" should read --The non-volatile memory of claim 18 wherein the--

- In Claim 21, Column 9, Line 66 of the patent, "The non volatile memory of claim 18 wherein the" should read --The non-volatile memory of claim 18 wherein the--

- In Claim 22, Column 10, Line 1 of the patent, "The non volatile memory of claim 18 wherein the" should read --The non-volatile memory of claim 18 wherein the--

- In Claim 23, Column 10, Line 4 of the patent, "The non volatile memory of claim 18 wherein:" should read --The non-volatile memory of claim 18 wherein:--

- In Claim 24, Column 10, Line 10 of the patent, "The non volatile memory of claim 18 wherein:" should read --The non-volatile memory of claim 18 wherein:--

- In Claim 25, Column 10, Line 17 of the patent, "The non volatile memory of claim 18 further comprising:" should read --The non-volatile memory of claim 18 further comprising:--

- In Claim 36, Column 12, Line 24 of the patent, "forming a insulating layer in a substrate" should read --forming an insulating layer in a substrate--

Signed and Sealed this
Thirty-first Day of May, 2011

David J. Kappos
*Director of the United States Patent and Trademark Office*